(12) United States Patent
Rogalla et al.

(10) Patent No.: US 7,592,195 B2
(45) Date of Patent: Sep. 22, 2009

(54) METHOD FOR PRODUCING A SENSOR OR ACTUATOR ARRANGEMENT, AND CORRESPONDING SENSOR OR ACTUATOR ARRANGEMENT

(75) Inventors: Markus Rogalla, Krozingen (DE); Ingo Freund, Vogtsburg-Oberrrottweil (DE); Mirko Lehmann, Freiburg (DE)

(73) Assignee: Micronas GmbH, Freiburg (DE)

( * ) Notice: Subject to any disclaimer, the term of this patent is extended or adjusted under 35 U.S.C. 154(b) by 416 days.

(21) Appl. No.: 10/504,738

(22) PCT Filed: Feb. 7, 2003

(86) PCT No.: PCT/EP03/01222

§ 371 (c)(1),
(2), (4) Date: Mar. 17, 2005

(87) PCT Pub. No.: WO03/068671

PCT Pub. Date: Aug. 21, 2003

(65) Prior Publication Data

US 2005/0155411 A1     Jul. 21, 2005

(30) Foreign Application Priority Data

Feb. 16, 2002   (DE) ............................... 102 06 464

(51) Int. Cl.
*H01L 21/00* (2006.01)
(52) U.S. Cl. .............................. 438/49; 438/51; 438/55; 438/64; 438/65; 257/E31.117; 257/E31.119
(58) Field of Classification Search .................. 438/49, 438/51, 55, 64, 65; 257/416, 417, 433, E31.117, 257/E31.119
See application file for complete search history.

(56) References Cited

U.S. PATENT DOCUMENTS 5,040,868 A    8/1991   Waitl et al. ..................... 358/33

(Continued)

FOREIGN PATENT DOCUMENTS

| DE | 4016721 | 9/1992 |
| DE | 4318407 | 12/1994 |
| DE | 10019488 | 10/2001 |

OTHER PUBLICATIONS

Baechi et al. "A high density microchannel network with integrated valves and photodiodes". Proceedings of the IEEE 14th, Annual International Conference on Microelectro Mechanical Systems, 2001.

(Continued)

*Primary Examiner*—David A Zarneke
(74) *Attorney, Agent, or Firm*—O'Shea Getz P.C.

(57) ABSTRACT

In a method for producing a sensor arrangement and the resulting sensor arrangement, a sensor is provided on or in a chip and the chip is covered with a protective cover, the cover being an interface between the sensor and the environment. An adhesive layer is provided between the chip and the protective cover, the adhesive layer alone or together with the protective cover being an interface between the sensor and the environment. The protective cover and/or the adhesive layer may have a channel formed therein, the channel functioning as the reception channel for a sensor. In an alternative embodiment, the protective cover placed on a wafer with several chips, and the wafer is cut up to produce the individual chips with the protective cover. Thus, a sensor arrangement may have the protective cover applied to the individual chip after the chip is cut from the wafer, or the protective cover may be applied to the wafer, and the wafer and cover are then cut up into the individual chips and corresponding covers. The channel leading from one side of the arrangement to the sensor may be taken through the adhesive layer, through the protective cover, or through both. A hole may be formed in the protective cover above the sensor, with the sensor lying loosely in the hole. The reaction volume may be determined by the dimensions of the hole.

24 Claims, 9 Drawing Sheets

U.S. PATENT DOCUMENTS

| | | | |
|---|---|---|---|
| 5,344,523 A * | 9/1994 | Fung et al. | 438/53 |
| 5,369,057 A * | 11/1994 | Lee et al. | 438/51 |
| 5,370,842 A * | 12/1994 | Miyazaki et al. | 422/82.06 |
| 5,454,055 A | 9/1995 | Kragl et al. | 385/14 |
| 5,599,503 A | 2/1997 | Manz et al. | 422/82.05 |
| 5,721,446 A * | 2/1998 | Kobayashi | 257/419 |
| 5,824,204 A * | 10/1998 | Jerman | 204/601 |
| 5,846,392 A | 12/1998 | Knoll | 205/778 |
| 5,852,320 A * | 12/1998 | Ichihashi | 257/419 |
| 6,054,277 A | 4/2000 | Furcht et al. | 435/6 |
| 6,169,316 B1 * | 1/2001 | Sakai et al. | 257/419 |
| 6,239,473 B1 * | 5/2001 | Adams et al. | 257/419 |
| 6,278,167 B1 * | 8/2001 | Bever et al. | 257/415 |
| 6,350,630 B1 * | 2/2002 | Wildgen | 438/51 |
| 6,440,725 B1 | 8/2002 | Pourahmadi et al. | 435/288.5 |
| 6,548,895 B1 * | 4/2003 | Benavides et al. | 257/712 |
| 6,610,563 B1 | 8/2003 | Waitl et al. | 438/166 |
| 6,789,430 B1 * | 9/2004 | Yoneda et al. | 73/754 |
| 7,033,664 B2 * | 4/2006 | Zilber et al. | 428/131 |
| 7,211,873 B2 * | 5/2007 | Toyoda | 257/417 |
| 2001/0018236 A1 | 8/2001 | Badehi | 438/127 |

OTHER PUBLICATIONS

Suzuki et al. "Micromachined sensing module for $pO_2$, $PCO_2$, and pH and its design optimization for practical use". Sensors and Actuators, vol. 76, No. 1-3, Jun. 1 2001, p. 565-572.

* cited by examiner

METHOD FOR PRODUCING A SENSOR OR ACTUATOR ARRANGEMENT, AND CORRESPONDING SENSOR OR ACTUATOR ARRANGEMENT

BACKGROUND OF THE INVENTION

The present invention relates in general to sensors, and in particular to a sensor arrangement and a method for producing such a sensor arrangement.

A method for producing a sensor arrangement and the corresponding sensor arrangement are known from published patent application WO 0143181 A1. In this known arrangement, a sensor, such as a chemical sensor, a micro-mirror array, an acceleration sensor, or an optoelectronic sensor, is arranged on a substrate or chip, and is covered with a protective cover. The protective cover is arranged at a distance from the sensor by means of spacers, so that a cavity sealed off from the outside is formed between the protective cover and the sensor.

However, in this known sensor arrangement, the advantage of a chip and sensor totally screened off from the outside is countered by the disadvantage that parameters of liquids or gases can no longer be measured or determined by means of the sensor, because the sensor is not accessible to gases and liquids.

What is needed is a sensor arrangement, and a method for producing same, such that the chip, with the sensor disposed on or in the chip, and its electrical connections, on the one hand, are safely screened off from the outside, but on the other hand the sensor remains freely accessible.

SUMMARY OF THE INVENTION

In a method for producing a sensor arrangement and the resulting sensor arrangement, at least one sensor is provided on or in a chip and the chip is covered with a first protective cover, the cover being an interface between the sensor and the environment. In the alternative, an actuator instead of a sensor may be provided on a chip. Nevertheless, it is to be understood that as used herein, the term sensor also includes an actuator. An adhesive layer may be provided between the chip and the first protective cover, the adhesive layer alone or together with the first protective cover being an interface between the sensor and the environment. The protective cover and/or the adhesive layer may have a channel formed therein, the channel functioning as the reception channel for a sensor or as the transmission channel for an actuator. This channel, which may run lateral to the surface of the chip, leads to the sensor from one side of the arrangement.

An alternative embodiment has the first protective cover placed on a wafer with several chips, and the wafer is cut up to produce the individual chips with the protective cover. Thus, a sensor arrangement may have the protective cover applied to the individual chip after the chip is cut from the wafer, or the protective cover may be applied to the wafer, and the wafer and cover are then cut up into the individual chips and corresponding covers.

In one embodiment, the channel leading from one side of the arrangement to the sensor is taken through the adhesive layer.

In a second embodiment, the channel leading from one side of the arrangement to the sensor is taken through the protective cover.

In a third embodiment, the channel leading from one side of the arrangement to the sensor is taken through both the adhesive layer and the protective cover.

A further embodiment includes a hole in the protective cover above the sensor, with the sensor lying loosely in the hole. The reaction volume may be determined by the dimensions of the hole. In this embodiment, the channel leads from one side of the chip to the hole.

A further embodiment includes at least one inlet hole and at least one outlet hole formed in the protective cover, the holes being joined together by at least one channel. In this case, a sensor may be arranged to be freely accessible. For example, the inlet hole and the outlet hole can be joined together by three channels. A sensor may be arranged in each channel. The sensors placed in the three channels may work totally independent of each other. Here, the reaction volume may be defined by the channels, as well as the inlet and the outlet holes.

A further embodiment calls for the protective cover to be transparent to light; for example, it can be an optical filter, an optical waveguide, or an optical lens.

The protective cover may protect the connection points of the chip against a medium being investigated, e.g., a corrosive gas or a corrosive liquid.

A further embodiment includes additional, yet removable protective covers on the first protective cover, which added covers may also be configured as an interface between the sensor and the environment.

These and other objects, features and advantages of the present invention will become more apparent in light of the following detailed description of preferred embodiments thereof, as illustrated in the accompanying drawings.

DETAILED DESCRIPTION OF THE INVENTION

Figure 1:
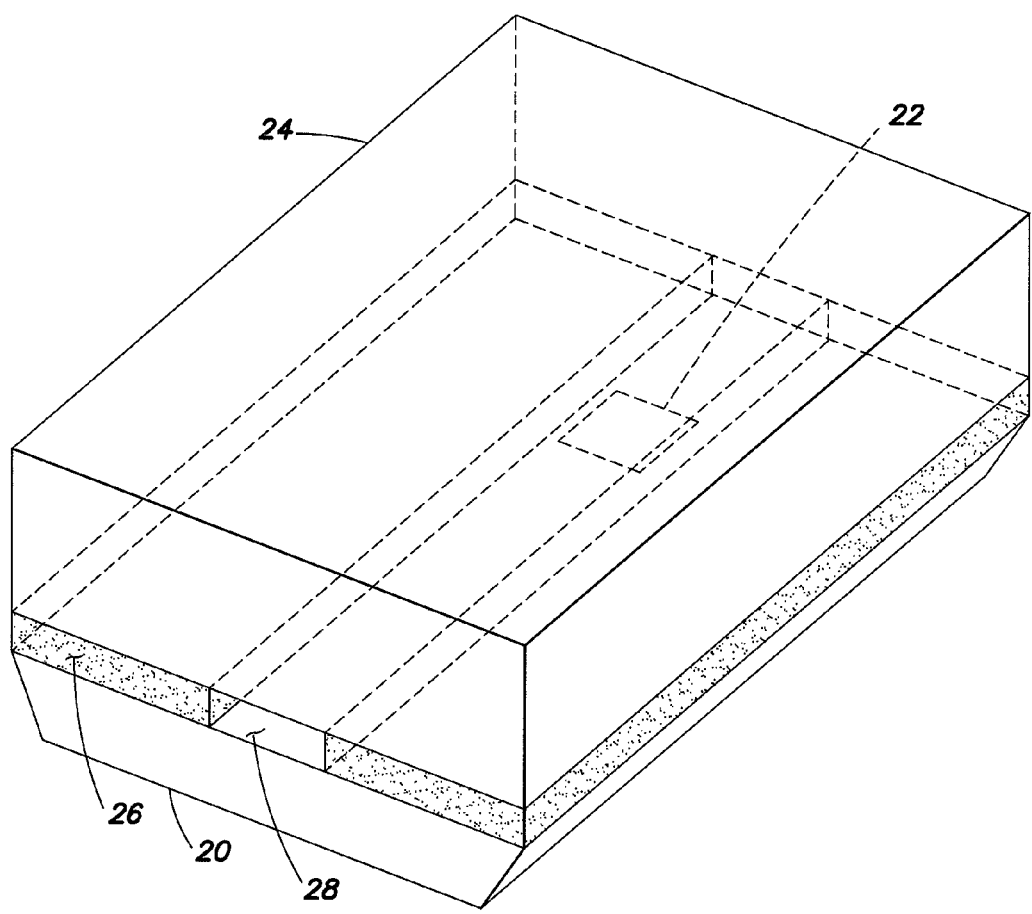
FIG. 1 is a perspective view of a first embodiment of a sensor arrangement.

Referring to FIG. 1, on a chip 20, in which a sensor 22 for example is embedded or is formed on, a protective cover 24 is glued by a layer of a bonding agent 26. In the bonding layer 26, a continuous channel 28 is made, in which the sensor 22 of the chip 20 lies so as to be freely accessible. Through the channel 28, a liquid or gaseous medium, for example, can flow and can be sensed by the sensor 22. The protective cover 24 can be transparent to light, for example, so that the reaction space above the sensor 22 can be observed. The channel 28 may determine the reaction volume. Since the channel 28 has a height corresponding to the thickness of the bonding layer, the bonding layer 26 alone may be structured. This embodiment therefore may be particularly easy to produce.

Figure 2:
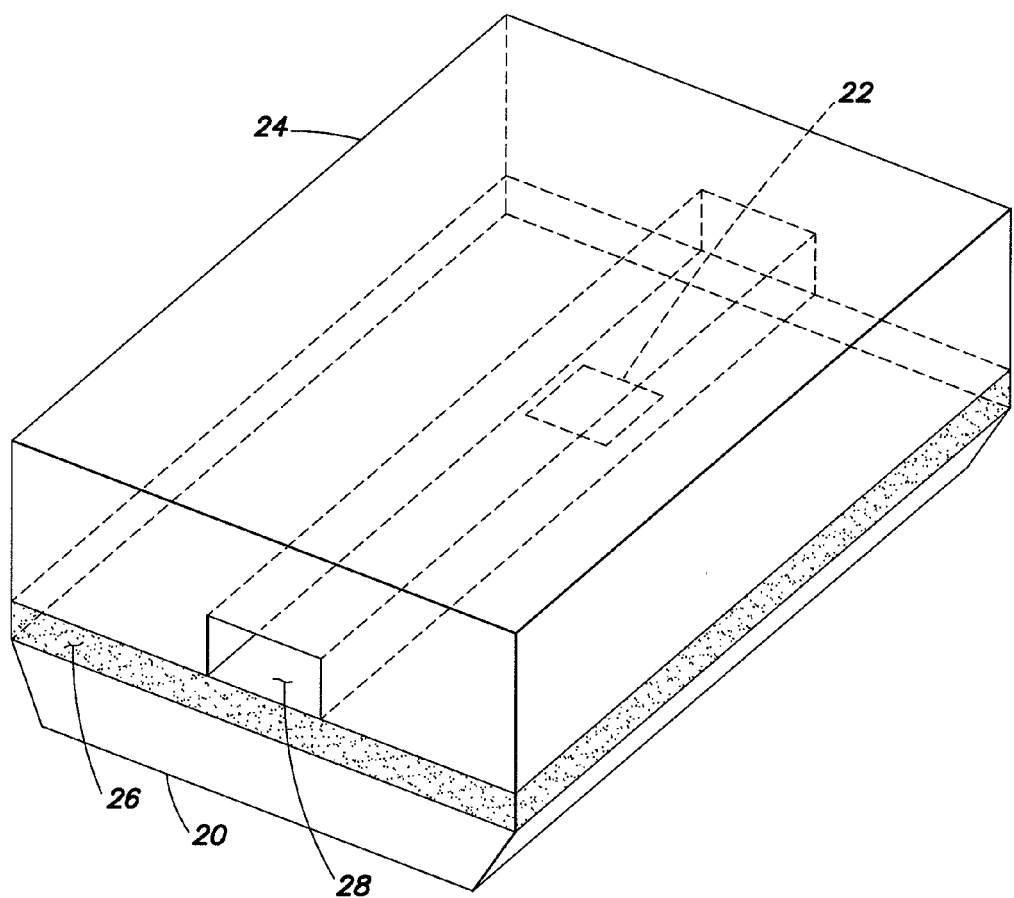
FIG. 2 is a perspective view of a second embodiment of a sensor arrangement.
Figure 3:
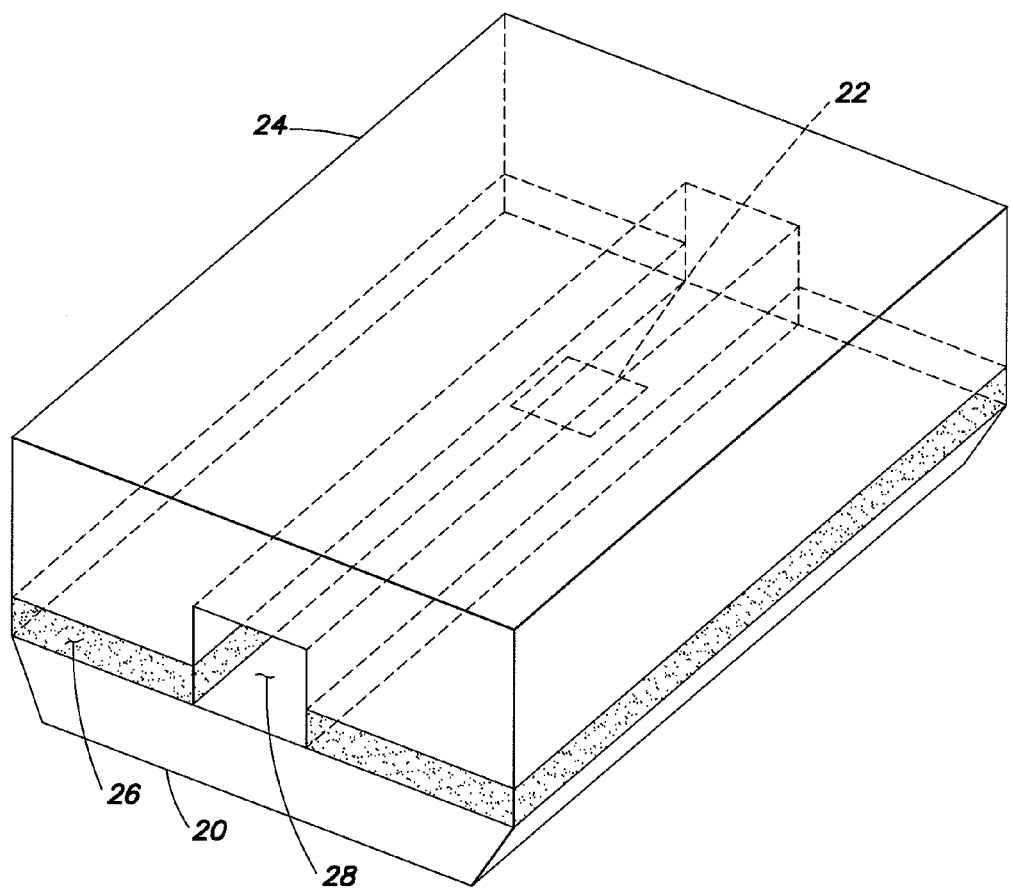
FIG. 3 is a perspective view of a third embodiment of a sensor arrangement.

In the embodiment of FIG. 2, the channel 28 is taken through the protective cover 24, whereas in the embodiment of FIG. 3 it is taken through both the bonding layer 26 and the protective cover 24.

Figure 4:
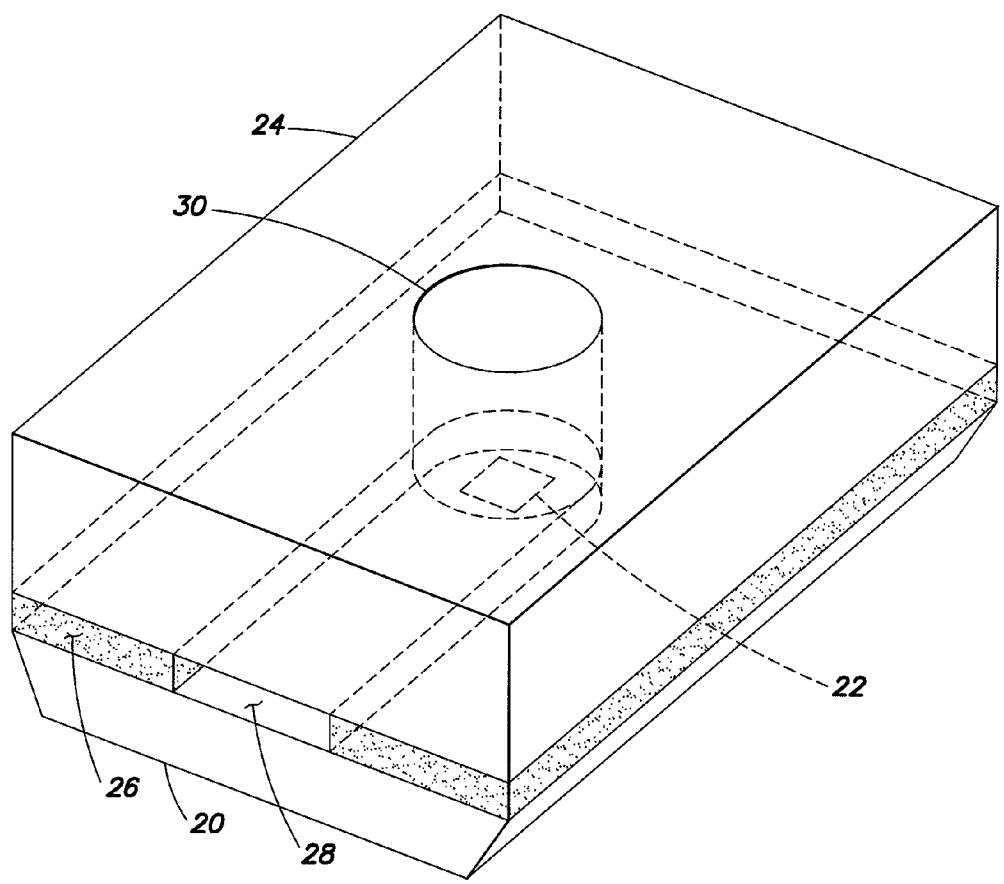
FIG. 4 is a perspective view of a fourth embodiment of a sensor arrangement.

Referring to a fourth embodiment which is illustrated in FIG. 4, just as in the first embodiment in FIG. 1, a protective cover 24 is glued by a bonding agent 26 onto a chip 20, in which a sensor 22 is embedded or formed on. A hole 30 is made in the protective cover 24 above the sensor 22, so that the sensor 22 is accessible from above through the hole 30. The channel 28 can be taken through the bonding layer 26, through the protective cover 24, or both. A gaseous or liquid medium, for example, can flow through the hole 30 and the channel 28.

Figure 5:
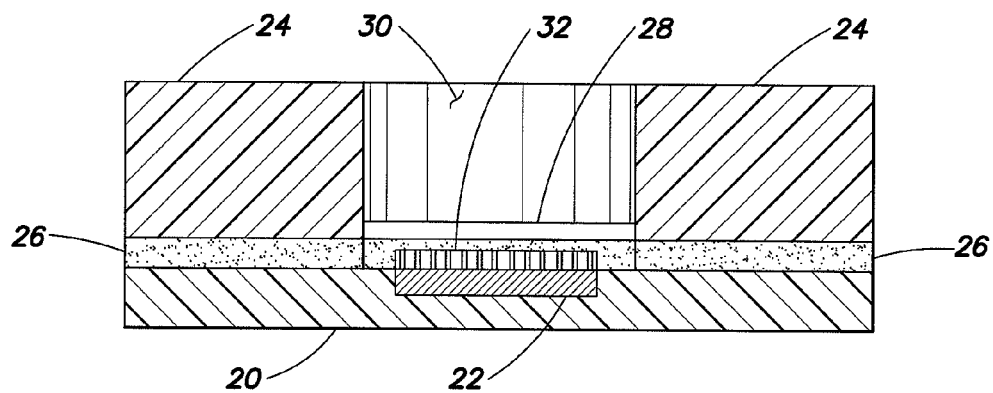
FIG. 5 is a section through the fourth embodiment of FIG. 4.

In FIG. 5, a section through the fourth embodiment is illustrated. For example, an optical filter 32 sits atop the sensor 22, which is embedded in or formed on the chip 20.

Figure 6:
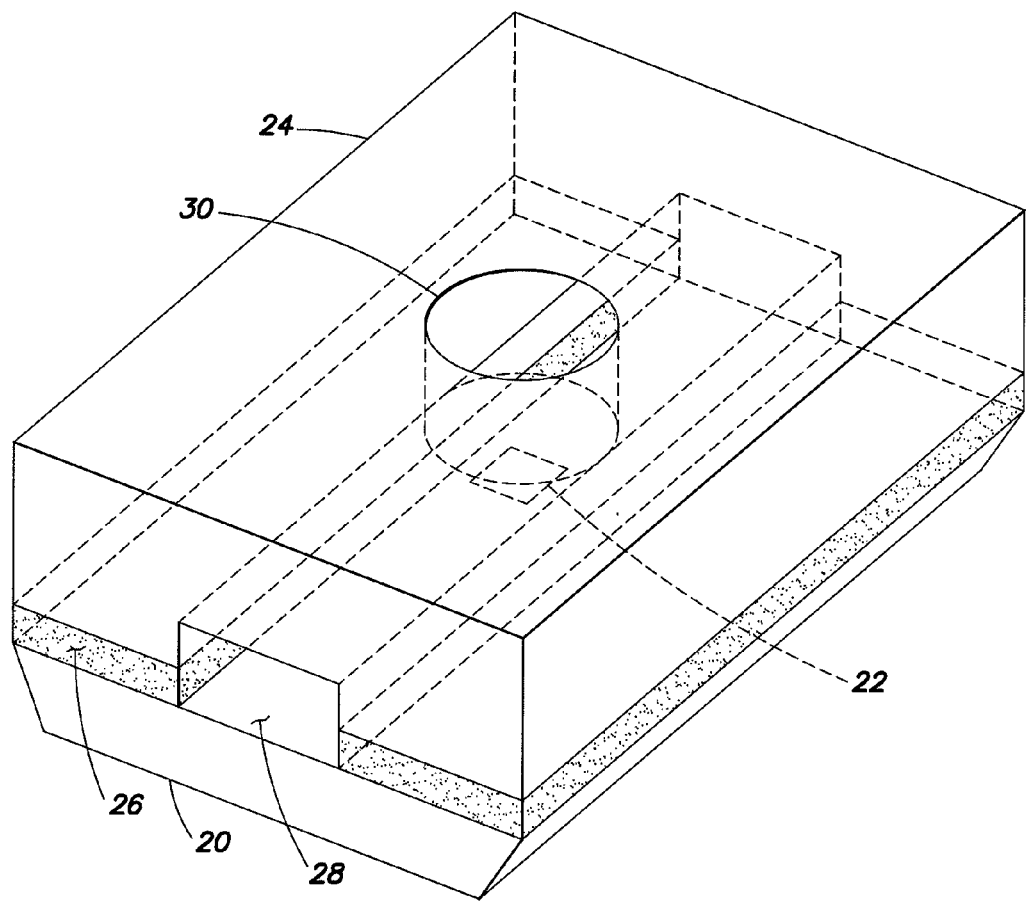
FIG. 6 is a perspective view of a fifth embodiment of a sensor arrangement.

In FIG. 6, a fifth embodiment of the invention is illustrated. A protective cover 24 is glued by a bonding agent 26 onto a chip 20 with a sensor 22. A channel 28 runs through the protective cover 24 and the bonding layer 26 from one side to the opposite side. Also, a hole 30 is made in the protective cover 24 from above. The channel 28 and the hole 30 intersect. At the point of intersection of the channel 28 and the hole 30, a sensor 22 of the chip 20 is placed. As in the preceding embodiments, the reaction volume may be defined by the hole 30 and the channel 28. For example, to observe the reaction volume, the protective cover 24 may be made from a material transparent to light, such as glass. The channel 28 can also be taken only through the bonding layer 26, for example, or only through the protective cover 24.

Figure 7:
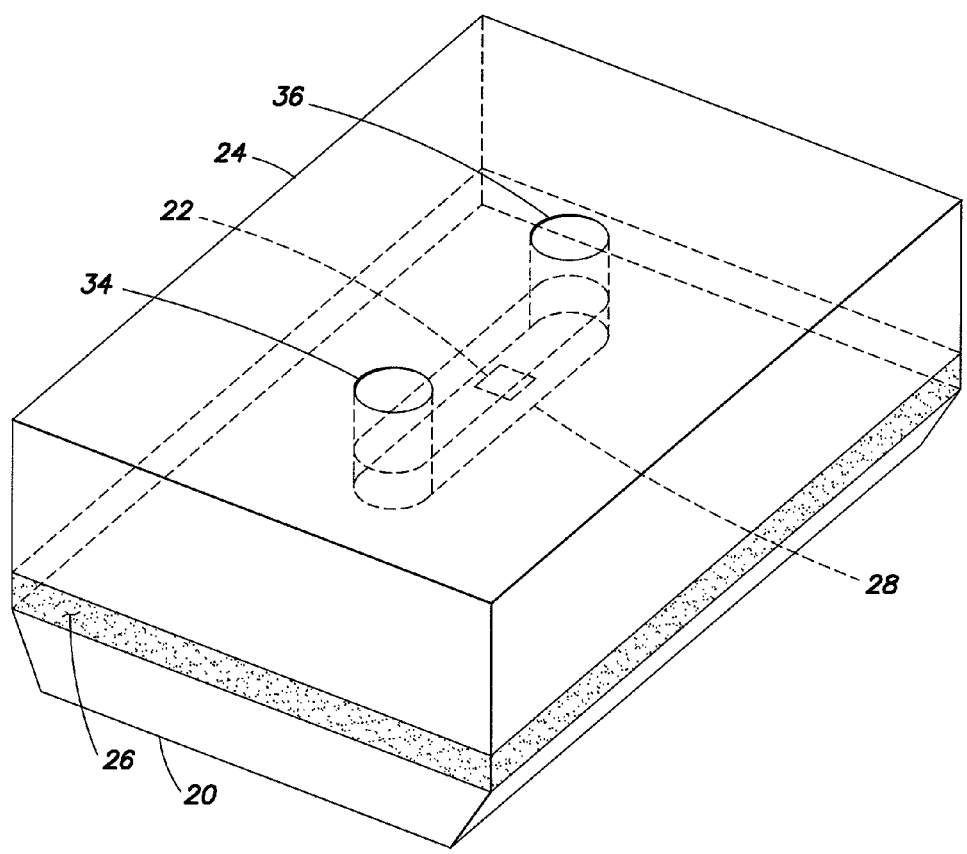
FIG. 7 is a perspective view of a sixth embodiment of a sensor arrangement.

FIG. 7 illustrates a sixth embodiment of the invention in perspective view. On a chip 20, a protective cover 24 is glued by a bonding agent 26, in which an inlet hole 34 and an outlet hole 36 are made. The inlet hole 34 and the outlet hole 36 are joined together via a channel 28 in the protective cover 24 and in the bonding layer 26, in which a sensor 22 of the chip 20 lies. For example, a gaseous or liquid medium can stream or flow into the inlet hole 34 and from there via the channel 28 to the outlet hole 36, where it again streams or flows out. The inlet hole 34, the channel 28 and the outlet hole 36 may determine the reaction volume. To observe the reaction volume from all sides, the protective cover 24 may comprise a transparent material, such as glass.

Figure 8:
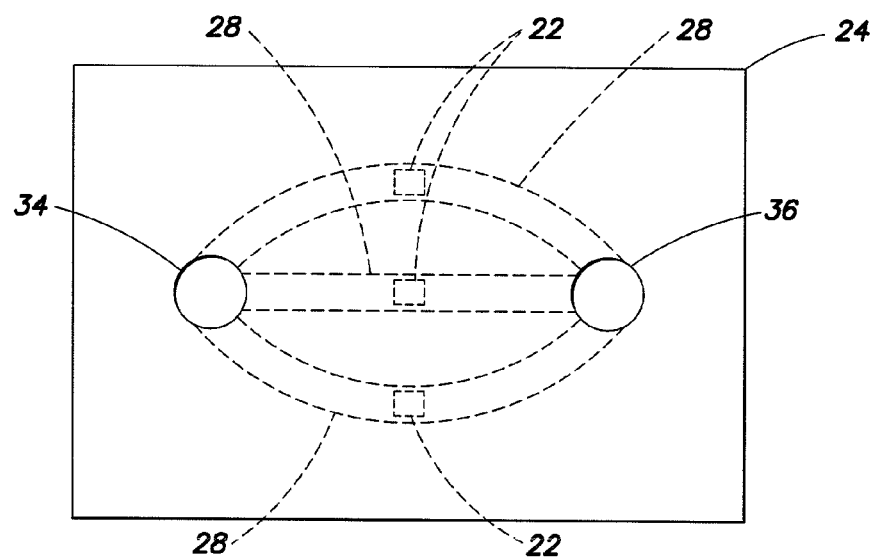
FIG. 8 is a top view of a seventh embodiment of a sensor arrangement.

In FIG. 8, a seventh embodiment is illustrated in top view. As in the preceding embodiments, a protective cover 24 is glued by a bonding agent 26 onto a chip 20. As in the seventh embodiment in FIG. 8, an inlet hole 34 and an outlet hole 36 are made in the upper side of the protective cover 24. The holes 34, 36 are joined together via a first, second and third channels 28. In each channel 28, a sensor 22 of the chip 20 is arranged. Various sensors 22 and actuators can also be combined and arranged in the channels 28. The seventh embodiment is not, however, limited to one inlet hole 34, one outlet hole 36, and three channels 28. The number of inlet holes 34, outlet holes 36, and channels 28 is optional. In the seventh embodiment as well in the other embodiments, the reaction volumes may be defined by the channels 28 and the holes 34, 36. For better observation of the reaction volumes, the protective cover 24 can be made from a material transparent to light, such as glass.

Figure 9:
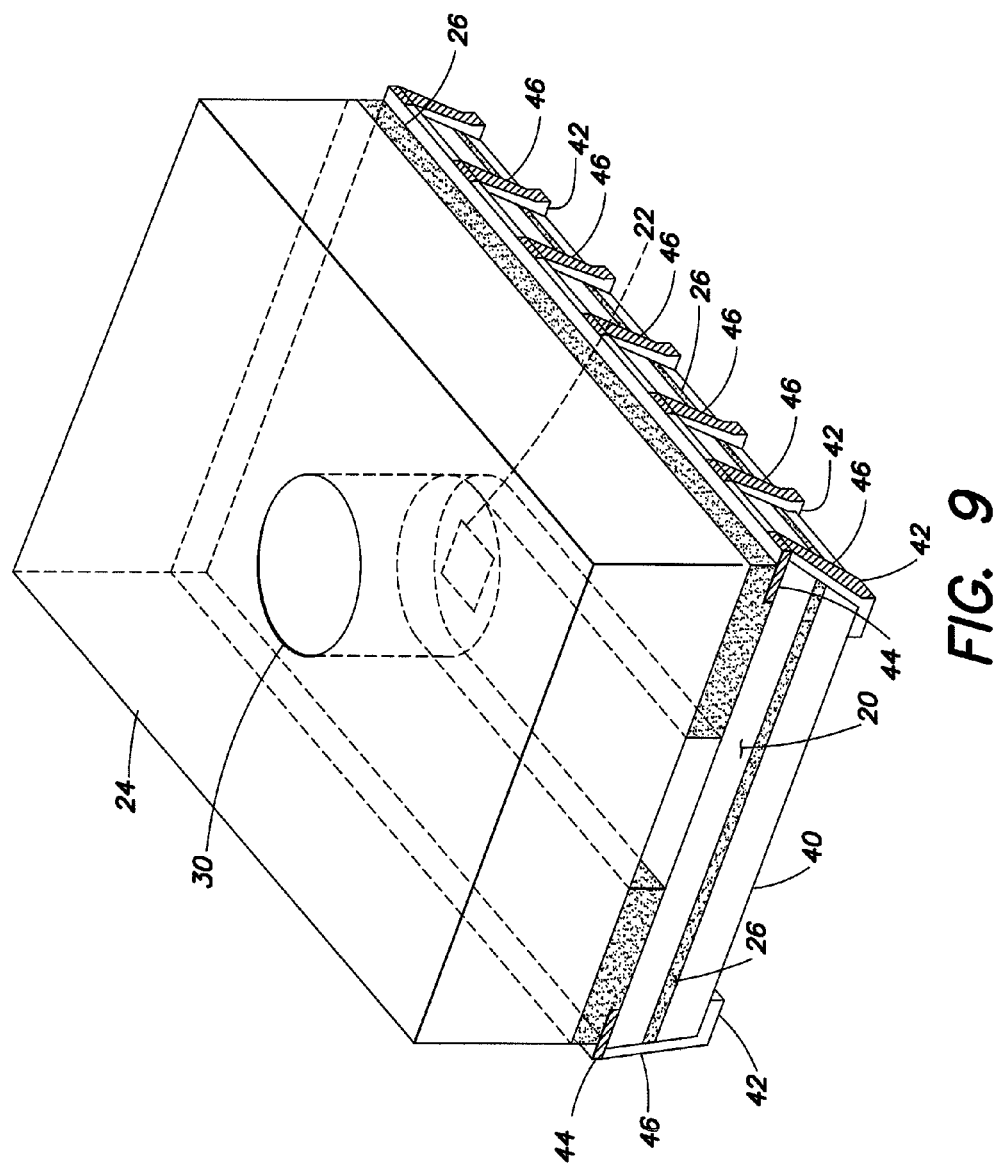
FIG. 9 is a perspective view of an eighth embodiment of a sensor arrangement.

In FIG. 9, an eighth embodiment is illustrated in perspective view. A glass substrate 40, on whose underside are arranged first contacts 42 (e.g., land grid array pads), is glued by a bonding agent 26 by its upper side onto the lower side of a chip 20, on whose upper side are arranged second contacts 44 (e.g., bond pads), which are connected via connections 46 to the land grid array pads 42. Onto the upper side of the chip 20, a protective cover 24 is glued by a bonding agent 26. In the upper side of the protective cover 24, a hole 30 is made, at the bottom of which there is a sensor 22 of the chip 20. The reaction volume may be defined by the hole 30. For better observation of the reaction volume, the protective cover 24 may comprise a material transparent to light, such as glass.

Figure 10:
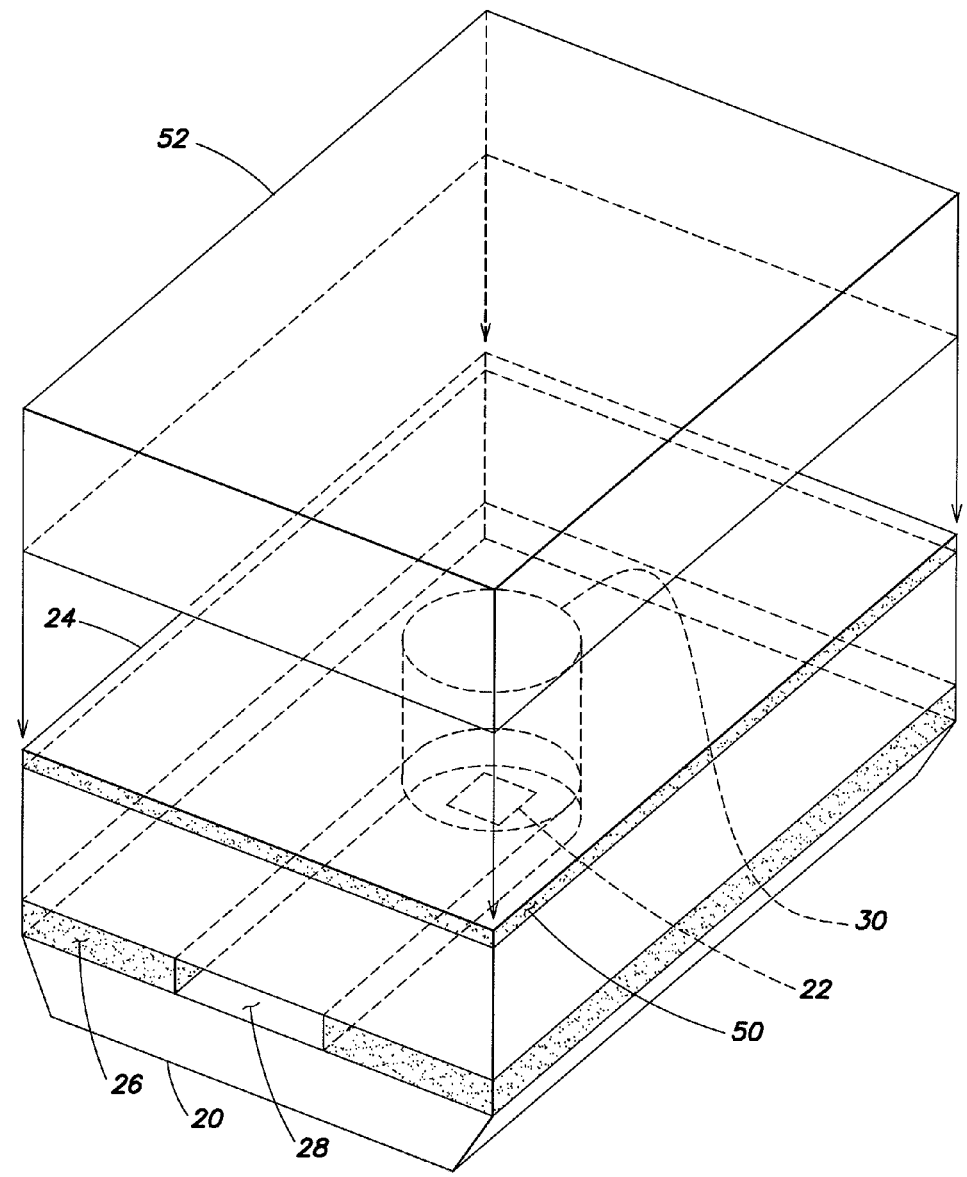
FIG. 10 is an exploded view of a ninth embodiment of a sensor arrangement.

In FIG. 10, a ninth embodiment of the invention is illustrated in exploded view. On the upper side of a chip 20 or a silicon wafer, a first protective cover 24 is glued by a bonding agent 26, in whose upper side a hole 30 is made, which leads to a sensor 22 arranged on the chip 20 or the silicon wafer. A channel 28 leads from one side of the arrangement to the hole 30. The channel 28, as in the other embodiments, can be taken only through the bonding layer 26, only through the first protective cover 24, or through both. On the lower side of the chip 20 or the silicon wafer, contact points 42 are arranged. On the upper side of the first protective cover 24 there is applied a coating seal 50, on which is placed a second removable protective cover 52, which is bounded by the reaction volume formed by the hole 30. The second protective cover 52 may comprise a material transparent to light, so that the reaction volume can be well observed. For example, the second protective cover 52 can be an optical filter to beam light with a defined frequency into the reaction volume.

The sensors 22 can be chemical sensors, mechanical sensors, acceleration sensors, or optoelectronic sensors, such as photodiodes, for example. The actuator can be, for example, a light emitting diode.

In the foregoing embodiments, the electrical contacts and the chip are securely protected, yet parameters of a liquid or a gas can be measured or determined by the sensor 22.

The number of holes 30, 34, 36 and channels 28 made in the protective cover 24 is optional. Any given combinations of holes and channels can be realized, which can be joined together, but need not necessarily be so.

Although the present invention has been shown and described with respect to several preferred embodiments thereof, various changes, omissions and additions to the form and detail thereof, may be made therein, without departing from the spirit and scope of the invention.

What is claimed is:

1. A method for producing a sensor arrangement, comprising:
  providing a sensor on a surface of a chip;
  depositing a structural bonding layer to at least a portion of the surface of the chip;
  depositing a first protective layer to the surface of the chip with the structural bonding layer; and
  forming a channel to extend from the sensor, at least partly through the structural bonding layer in a lateral direction, to the surface of at least one of the chip and the first protective layer.

2. The method of claim 1, further comprising:
  configuring and positioning a second sensor on the surface of a second chip; and
  where the chip and the second chip are located on a wafer;
  where the structural bonding layer is applied to the wafer.

3. The method of claim 1, where the channel extends from one side of the arrangement to the sensor.

4. The method of claim 1, where the channel extends through the structural bonding layer.

5. The method of claim 1, where the channel extends through the first protective cover.

6. The method of claim 1, where the channel extends through the structural bonding layer and through the first protective cover.

7. The method of claim 1, further comprising configuring an aperture above the sensor and through the structural bonding layer and the first protective cover.

8. The method of claim 1, further comprising configuring an inlet aperture and an outlet aperture in the first protective cover to be joined together by the channel.

9. The method of claim 7, where a reaction volume is defined at least in part by the aperture.

10. The method of claim 1, where the first protective cover is transparent to light.

11. The method of claim 1, where the first protective cover is an optical filter.

12. The method of claim 1, where the first protective cover is an optical waveguide.

13. The method of claim 1, where the first protective cover is an optical lens.

14. The method of claim 1, where the first protective cover protects contacts in the form of bond pads of the chip against a medium being investigated.

15. The method of claim 14, further comprising removably coupling a second protective cover to the first protective cover.

16. The method of claim 15, where the second protective cover is an interface between the sensor and an outside environment.

17. The method of claim 15, where the second protective cover comprises a material transparent to light.

18. The method of claim 1, further comprising:
arranging a plurality of first electrical contacts on an underside of the chip;
arranging a plurality of second electrical contacts on an upper side of at least one of the chip and the first protective cover; and
connecting the first electrical contacts to the second electrical contacts.

19. The method of claim 18, where the first electrical contacts comprise land grid array pads and the second electrical contacts comprise bond pads.

20. A method for producing a sensor arrangement, comprising:
providing a chip having a sensor associated therewith;
affixing a protective cover to the chip using a structural bonding layer; and
providing a channel so that the sensor is exposed by the channel to an environment external to the sensor arrangement, where the channel extends at least partly through the structural bonding layer in a lateral direction.

21. The method of claim 20, wherein the step of providing a channel further comprises the step of providing the channel in the structural bonding layer and in the protective cover.

22. The method of claim 20, wherein the step of providing a channel further comprises the step of providing the channel in an orientation that is at least partly lateral to a surface of the chip.

23. The method of claim 20, further comprising the step of forming a hole in the protective cover and in the structural bonding layer where the sensor is accessible through the hole.

24. The method of claim 20, further comprising the step of forming an inlet hole and an outlet in the protective cover and in the structural bonding layer, the inlet and outlet holes being connected by at least one channel.

* * * * *